(12) United States Patent
Althaus et al.

(10) Patent No.: US 12,557,671 B2
(45) Date of Patent: Feb. 17, 2026

(54) POWER SEMICONDUCTOR MODULE AND METHOD OF PRODUCING A POWER SEMICONDUCTOR MODULE

(71) Applicant: Infineon Technologies AG, Neubiberg (DE)

(72) Inventors: Achim Althaus, Regensburg (DE); Andreas Groove, Rüthen (DE); Christoph Liebl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 423 days.

(21) Appl. No.: 18/342,394

(22) Filed: Jun. 27, 2023

(65) Prior Publication Data

US 2025/0006601 A1    Jan. 2, 2025

(51) Int. Cl.
| | |
|---|---|
| *H01L 23/00* | (2006.01) |
| *H01L 23/31* | (2006.01) |
| *H01L 23/495* | (2006.01) |
| *H01L 25/07* | (2006.01) |

(52) U.S. Cl.
CPC .... *H01L 23/49568* (2013.01); *H01L 23/3107* (2013.01); *H01L 23/49562* (2013.01); *H01L 23/49575* (2013.01); *H01L 24/08* (2013.01); *H01L 24/48* (2013.01); *H01L 25/072* (2013.01); *H01L 2224/08055* (2013.01); *H01L 2224/08245* (2013.01); *H01L 2224/48145* (2013.01); *H01L 2224/48227* (2013.01); *H01L 2224/48247* (2013.01); *H01L 2924/13091* (2013.01); *H01L 2924/1811* (2013.01)

(58) Field of Classification Search
CPC ........... H01L 23/49568; H01L 23/3107; H01L 23/49562; H01L 23/49575; H01L 24/08; H01L 24/48; H01L 25/072; H01L 2224/08055; H01L 2224/08245; H01L 2224/48145; H01L 2224/48227; H01L 2224/48247; H01L 2924/13091; H01L 2924/1811; H01L 23/49531; H01L 25/18; H01L 25/074; H01L 23/492; H01L 24/85; H01L 25/50; H02M 1/00; H02M 7/003; H02M 7/5387

See application file for complete search history.

(56) References Cited

U.S. PATENT DOCUMENTS

2013/0015495 A1    1/2013   Hauenstein

FOREIGN PATENT DOCUMENTS

| CN | 107195623 A | 9/2017 |
|---|---|---|
| WO | 2021167596 A1 | 8/2021 |
| WO | 2022017789 A1 | 1/2022 |

*Primary Examiner* — Elias Ullah
(74) *Attorney, Agent, or Firm* — Murphy, Bilak & Homiller, PLLC

(57) ABSTRACT

A power semiconductor module includes an AC bus bar having a first side that faces a first substrate and a second side that faces a second substrate. A first power transistor die has a drain terminal connected to a first metallic region of the first substrate and a source terminal connected to the first side of the AC bus bar. A second power transistor die has a drain terminal connected to the second side of the AC bus bar and a source terminal connected to a first metallic region of the second substrate. First and second DC bus bars are connected to the first metallic region of the respective substrates, vertically overlap one another, and protrude from a first side of a mold body that encapsulates the power transistor dies. The AC bus bar protrudes from a different side of the mold body as the DC bus bars.

21 Claims, 9 Drawing Sheets

POWER SEMICONDUCTOR MODULE AND METHOD OF PRODUCING A POWER SEMICONDUCTOR MODULE

BACKGROUND

Within an electric drivetrain, a traction inverter controls an electric motor. The traction inverter is an important component in an electric vehicle, since the inverter determines driving behavior. Regardless of whether the motor is synchronous, asynchronous or brushless DC, the traction inverter always functions in a similar way and may be controlled by a system that includes a power semiconductor module. The power semiconductor module should be designed to minimize switching losses and maximize thermal efficiency. The traction inverter drives the electric motor and captures energy released through regenerative breaking and feeds this energy back to the battery. As a result, the range of the vehicle is directly related to the efficiency of the traction inverter. Accordingly, the inductivity of the power semiconductor module should be as low as possible to reduce switching losses, particularly when fast switching power transistor dies (chips) such as SiC MOSFETs (metal-oxide-semiconductor field-effect transistors) are used in the module.

Conventional power semiconductor modules have inductivities down to 3.5 nH, which is not low enough for SiC MOSFET and other types of fast switching power transistor technologies. Chip embedded technology yields inductivities down to about 700 pH, but still lower inductivities would yield increased efficiency. Also, stray inductivities cannot be entirely avoided and add to the overall inductivity of a power semiconductor module.

Hence, there is a need for an improved power semiconductor module design having an ultra-low inductivity below 700 pH.

SUMMARY

According to an embodiment of a power semiconductor module, the power semiconductor module comprises: a first substrate; a second substrate; an AC bus bar having a first side that faces the first substrate and a second side that faces the second substrate; a first power transistor die having a drain terminal connected to a first metallic region of the first substrate and a source terminal connected to the first side of the AC bus bar; a second power transistor die having a drain terminal connected to the second side of the AC bus bar and a source terminal connected to a first metallic region of the second substrate; a mold body encapsulating the first power transistor die and the second power transistor die; a first DC bus bar connected to the first metallic region of the first substrate and protruding from a first side of the mold body; and a second DC bus bar connected to the first metallic region of the second substrate, vertically overlapping the first DC bus bar, and protruding from the first side of the mold body, wherein the AC bus bar protrudes from a different side of the mold body as the first and second DC bus bars.

According to an embodiment of a method of producing a power semiconductor module, the method comprises: connecting a drain terminal of a first power transistor die to a first metallic region of a first substrate; connecting a first side of an AC bus bar to a source terminal of the first power transistor die; connecting a drain terminal of a second power transistor die to a second side of the AC bus bar; connecting a first metallic region of a second substrate to a source terminal of the second power transistor die; connecting a first DC bus bar to the first metallic region of the first substrate; connecting a second DC bus bar to the first metallic region of the second substrate; and encapsulating the first power transistor die and the second power transistor die in a mold body, wherein the first DC bus bar protrudes from a first side of the mold body, wherein the second DC bus bar vertically overlaps the first DC bus bar and protrudes from the first side of the mold body, wherein the AC bus bar protrudes from a different side of the mold body as the first and second DC bus bars.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor module design having an ultra-low inductivity below 700 pH and a method of producing the module. The ultra-low inductivity is achieved by vertically overlapping the positive (+) and negative (−) DC busbar connections which yields a small current loop area, e.g. the commutation loop, for effectively distributing current. Also, the high-side and low-side power transistor dies that form a power electronics circuit included in the module are stacked on opposite sides of the AC bus bar.

The die stacking may result in a higher thermal resistance, even though the power semiconductor module is cooled from two sides by corresponding main heat pathways within the module. Any increase in thermal resistance may be mitigated by adding one or more auxiliary heat pathways that complement the main heat pathways, by forming thermal connections between the AC bus bar and electrically isolated areas of upper and/or lower substrates included in the power semiconductor module. Each auxiliary heat pathway may be realized by a metallic or ceramic spacer, brazed substrate, half edged substrate, sintered joint or any other type of thermally conductive body having a higher thermal conductivity than a mold body that encapsulates the power transistor dies.

Described next, with reference to the figures, are exemplary embodiments of the power semiconductor module and methods of producing such a power semiconductor module. Any of the embodiments described next may be used interchangeably unless otherwise expressly stated.

Figure 1:
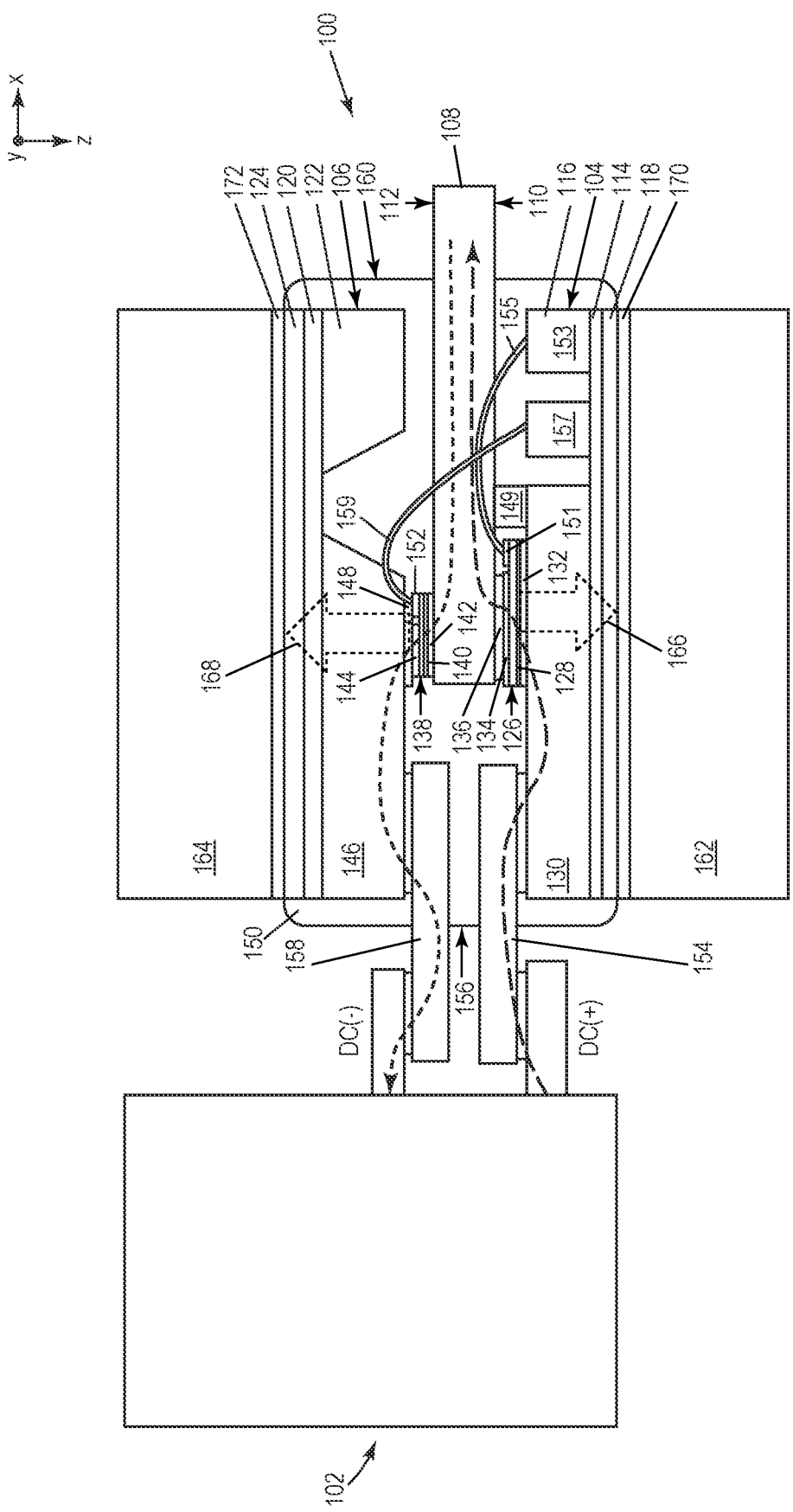
FIG. 1 illustrates a cross-sectional view of an embodiment of a power semiconductor module.

FIG. 1 illustrates a cross-sectional view of an embodiment of a molded power semiconductor module 100. The power semiconductor module 100 may be connected to a circuit board 102 such as a PCB (printed circuit board), capacitor bank with power supply, etc. to form part of a power electronics circuit for use in various power applications such as in a DC/AC inverter, a DC/DC converter, an AC/DC converter, a DC/AC converter, an AC/AC converter, a multi-phase inverter, an H-bridge, etc. For example, the power electronics circuit implemented by the power semiconductor module 100 and circuit board 102 may be a traction inverter for controlling an electric motor.

The molded power semiconductor package 100 includes a first substrate 104, a second substrate 106, and an AC bus bar 108 having a first side 110 that faces the first substrate 104 and a second side 112 that faces the second substrate 106. The first substrate 104 may be, e.g., a DBC (direct bonded copper) substrate, an AMB (active metal brazed) substrate, or an IMS (insulated metal substrates), where in each case an insulating body 114 such as a ceramic separates inner and outer metallized sides 116, 118 of the first substrate 104 from one another. The second substrate 106 also may be a DBC substrate, an AMB substrate, or an IMS, where in each case an insulating body 120 such as a ceramic separates inner and outer metallized sides 122, 124 of the second substrate 106 from one another. The substrates 104, 106 instead may be lead frames, for example.

The molded power semiconductor package 100 also includes one or more first power transistor dies 126 having a drain terminal 128 electrically and thermally connected to a first metallic region 130 of the first substrate 104, e.g., by a die attach material or sintered joint 132, and a source terminal 134 electrically and thermally connected to the first side 110 of the AC bus bar 108 by a spacer 136 such as a Cu block.

The molded power semiconductor package 100 further includes one or more second power transistor dies 138 having a drain terminal 140 electrically and thermally connected to the second side 112 of the AC bus bar 108, e.g., by a die attach material or sintered joint 142, and a source terminal 144 electrically and thermally connected to a first metallic region 146 of the second substrate 106 by a spacer 148 such as a Cu block. The spacers 136, 148 prevent contact between the source terminals 144 of the power transistor dies 126, 138 and the AC bus bar 108. A mold body 150 such as a mold compound or similar type of resin encapsulates the power transistor dies 126, 138.

A thermally conductive body 149 may be connected between the first metallic region 130 of the first substrate 104 and the first side 110 of the AC bus bar 108, the thermally conductive body 149 having a higher thermal conductivity than the mold body 150. A second power transistor die 138 may vertically overlap the thermally conductive body 149, with the region of vertical overlap being out of view in FIG. 1.

As shown in FIG. 1, the power transistor dies 126, 138 are vertical power transistor dies. For a vertical power transistor die, the primary current flow path is between the front and back sides of the respective die 126, 138. The drain terminal 128, 140 is typically disposed at the backside of the corresponding die 126, 138, with the source terminal 134, 144 and a respective gate terminal 151, 152 at the die frontside. The gate terminal 151 of each first power transistor die 126 may be electrically connected to a second metallic region 153 of the first substrate 104 by a first bond wire 155. The gate terminal 152 of each second power transistor die 138 may be electrically connected to a third metallic region 157 of the first substrate 104 by a second bond wire 159. The first and second power transistor dies 126, 138 may be power Si or SiC power MOSFET (metal-oxide-semiconductor field-effect transistor) dies, HEMT (high-electron mobility transistor) dies, IGBT (insulated-gate bipolar transistor) dies, JFET (junction filed-effect transistor) dies, etc.

The first and second power transistor dies 126, 138 may be electrically interconnected to form a power electronics circuit such as a half bridge, e.g., with the first power semiconductor die(s) 126 forming a high-side switch of the half bridge and the second power semiconductor die(s) 138 forming a low-side switch of the half bridge. In the case of a half bridge formed by the first and second power transistor dies 126, 138, the AC bus bar 108 provides a switch node connection to the half bridge. Additional types of semiconductor dies may be included in the power semiconductor package 100, such as power diode dies, logic dies, controller dies, gate driver dies, etc.

The molded power semiconductor package 100 also includes a first DC bus bar 154 which is at a positive (+) DC potential and connected to the first metallic region 130 of the first substrate 104 and protruding from a first side 156 of the mold body 150. A second DC bus bar 158 which is at a negative (-) DC potential or ground is connected to the first metallic region 146 of the second substrate 106, vertically overlaps (z direction in FIG. 1) the first DC bus bar 154, and protrudes from the first side 156 of the mold body 150. The AC bus bar 108 protrudes from a different side 160 of the mold body 150 as the first and second DC bus bars 154, 158.

Current flows into the molded power semiconductor package 100 from the first DC bus bar 154, through the first power transistor die(s) 126 and out through the AC bus bar 108. The current return path is through the AC bus bar 108 and the second power transistor die(s) 138 to the second DC bus bar 158. The current supply and return paths are indicated by corresponding dashed lines in FIG. 1.

A small module footprint and an ultra-low inductivity below 700 pH are achieved by vertically overlapping the positive (+) and negative (-) DC busbars 154, 158, which forms a small current loop area, e.g. the commutation loop, that effectively distributes the current. To vertically overlap the positive (+) and negative (-) DC busbars 154, 158 in a compact area, the first and second power transistor dies 126, 138 are vertically stacked on above the other on opposite sides 110, 112 of the AC bus bar 108, thereby lowering stray inductance in support of higher switching frequencies.

The power molded semiconductor module 100 may be cooled from two sides by respective heat sinks 162, 164 and corresponding main heat pathways 166, 168 within the power module 100. The bottom (lower) heat sink 162 may be coupled to the outer metallized side 118 of the first substrate 104 by a first thermal interface material 170. The top (upper) heat sink 164 may be coupled to the outer metallized side 124 of the second substrate 106 by a second thermal interface material 172. The heat sinks 162, 164 may be passively or actively cooled.

The first (lower) main heat pathway 166 within the power semiconductor module 100 includes the first metallic region 130 of the first substrate 104, the die attach material or sintered joint 132 that connects the drain terminal 128 of each first power transistor die 126 to the first metallic region 130 of the first substrate 104, the insulating body 114 of the first substrate 104, and the outer metallized side 118 of the first substrate 104. The second (upper) main heat pathway 168 within the power semiconductor module 100 includes the first metallic region 146 of the second substrate 106, each spacer 148 that connects the source terminal 144 of a second power transistor die 138 to the first metallic region 146 of the second substrate 106, the insulating body 120 of the second substrate 106, and the outer metallized side 124 of the second substrate 106.

Simulations of the power module design illustrated in FIG. 1 have demonstrated module inductivities in a range of 270 pH to 550 pH, depending on the thickness of the lower and upper spacers 132, 148. The die stacking arrangement shown in FIG. 1 may result in a higher thermal resistance (Rth), even though the power semiconductor module 100 is cooled from two sides. More particularly, the upper spacer 148 included in the second (upper) main heat pathway 168 may increase Rth of the second main heat pathway 168 between the second power transistor die 138 and the outer metallized side 124 of the second substrate 106.

Figure 2:
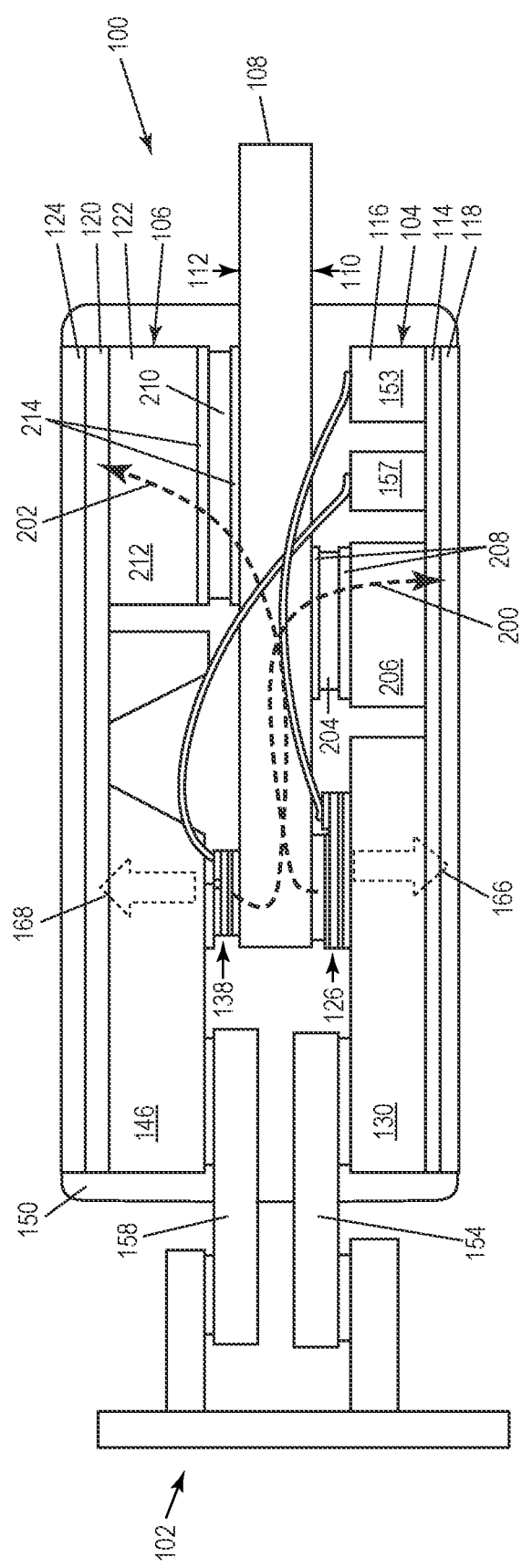
FIG. 2 illustrates a cross-sectional view of the power semiconductor module, according to another embodiment.

FIG. 2 illustrates a cross-sectional view of the molded power semiconductor module 100, according to another embodiment. In FIG. 2, the molded power semiconductor module 100 includes one or more auxiliary heat pathways 200, 202 that complement the main heat pathways 166, 168. A first (lower) auxiliary heat pathway 200 may be formed by a thermally conductive body 204 connected between the first side 110 of the AC bus bar 108 and a metallic region 206 of the first substrate 104 that is electrically isolated from the first metallic region 130 of the first substrate 104. The thermally conductive body 204 is connected between the first side 110 of the AC bus bar 108 and the separate metallic region 206 of the first substrate 104 before encapsulating the power transistor dies 126, 138 in the mold body 150.

The thermally conductive body 204 has a higher thermal conductivity than the mold body 150 and therefore results in a lower module Rth. For example, the thermally conductive body 204 may be a metallic or ceramic spacer attached to the separate metallic region 206 of the first substrate 104 and the first side 110 of the AC bus bar 108, e.g., by a die attach material or sintered joint 208. In another embodiment, the thermally conductive body 204 is a sintered joint between the separate metallic region 206 of the first substrate 104 and the first side 110 of the AC bus bar 108.

Separately or in combination, a second (upper) auxiliary heat pathway 202 may be formed by a thermally conductive body 210 connected between the second side 112 of the AC bus bar 108 and a metallic region 212 of the second substrate 106 that is electrically isolated from the first metallic region 146 of the second substrate 106. The thermally conductive body 210 is connected between the second side 112 of the AC bus bar 108 and the separate metallic region 212 of the second substrate 106 before encapsulating the power transistor dies 126, 138 in the mold body 150.

The thermally conductive body 210 connected between the second side 112 of the AC bus bar 108 and the separate metallic region 212 of the second substrate 106 has a higher thermal conductivity than the mold body 150 and therefore results in a lower module Rth. For example, the thermally conductive body 210 connected between the second side 112 of the AC bus bar 108 and the separate metallic region 212 of the second substrate 106 may be a metallic or ceramic spacer attached to the separate metallic region 212 of the second substrate 106 and the second side 112 of the AC bus bar 108, e.g., by a die attach material or sintered joint 214. In another embodiment, the thermally conductive body 210 connected between the second side 112 of the AC bus bar 108 and the separate metallic region 212 of the second substrate 106 is a sintered joint between the separate metallic region 212 of the second substrate 106 and the second side 112 of the AC bus bar 108.

As previously explained herein, the substrates 104, 106 may be DBC substrates, AMB substrates, or IMSs. In each of these cases, the metallic regions 206, 212 of the substrates 104, 106 to which the corresponding thermally conductive bodies 204, 210 are connected may be electrically isolated from the first metallic region 130, 146 of the respective substrates 104, 106 by patterning the inner metallized sides 116, 122 of the substrates 104, 106 that face inward toward one another. Also as previously explained herein, the substrates 104, 106 instead may be lead frames with features formed by stamping, punching, etching, etc. In this case, the metallic regions 206, 212 of the substrates 104, 106 to which the corresponding thermally conductive bodies 204, 210 are connected may be implemented as additional lead frames.

FIGS. 3A through 3G illustrate top plan views during different stages of producing the power semiconductor module 100, according to an embodiment.

Figure 3A:
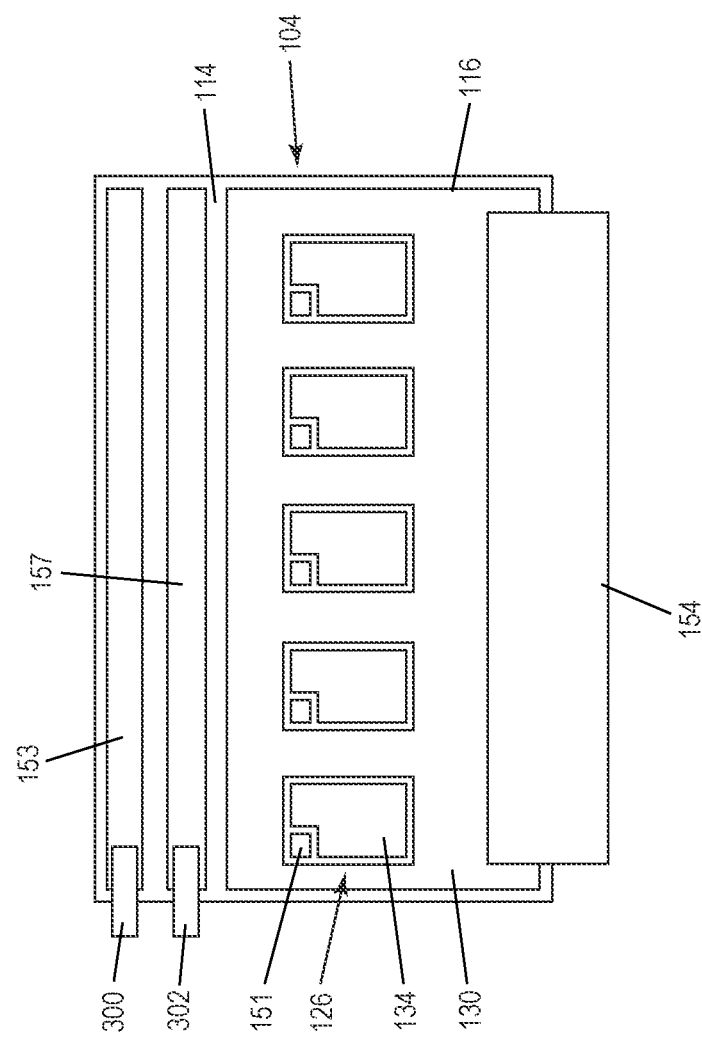
FIGS. 3A through 3G illustrate top plan views of the power semiconductor module during different stages of production, according to an embodiment.

FIG. 3A shows a plurality of first power transistor dies 126 attached to the inner patterned metallized side 116 of the first substrate 104, where the drain terminal 128 (out of view in FIG. 3A) of each first power transistor die 126 is electrically and thermally connected to the first metallic region 130 of the first substrate 104. Five (5) first power transistor dies 126 are shown in FIG. 3A, as an example. However, more or less first power transistor dies 126 may be used. In general, one or more first power transistor dies 126 is attached to the inner patterned metallized side 116 of the first substrate 104. If more than one first power transistor die 126 is used, the first power transistor dies 126 may be electrically coupled in parallel within the power semiconductor module 100 to form a switch device such as a high-side switch of a half bridge.

Also in FIG. 3A, the first (+) DC bus bar 154 is connected to the first metallic region 130 of the first substrate 104 and respective gate leads 300, 302 are connected to the separate metallic gate regions 153, 157 of the first substrate 104. The gate leads 300, 302 provide signal connections for the power transistor dies 126, 138, whereas the first DC bus bar 154 provides a positive (+) DC potential for the drain terminal 128 of each first power transistor die 126. The gate leads 300, 302 and the first DC bus bar 154 may be provided as part of a lead frame or other type of patterned metallic sheet, e.g., where the first DC bus bar 154 may have a heavier gauge than the gate leads 300, 302.

Figure 3B:
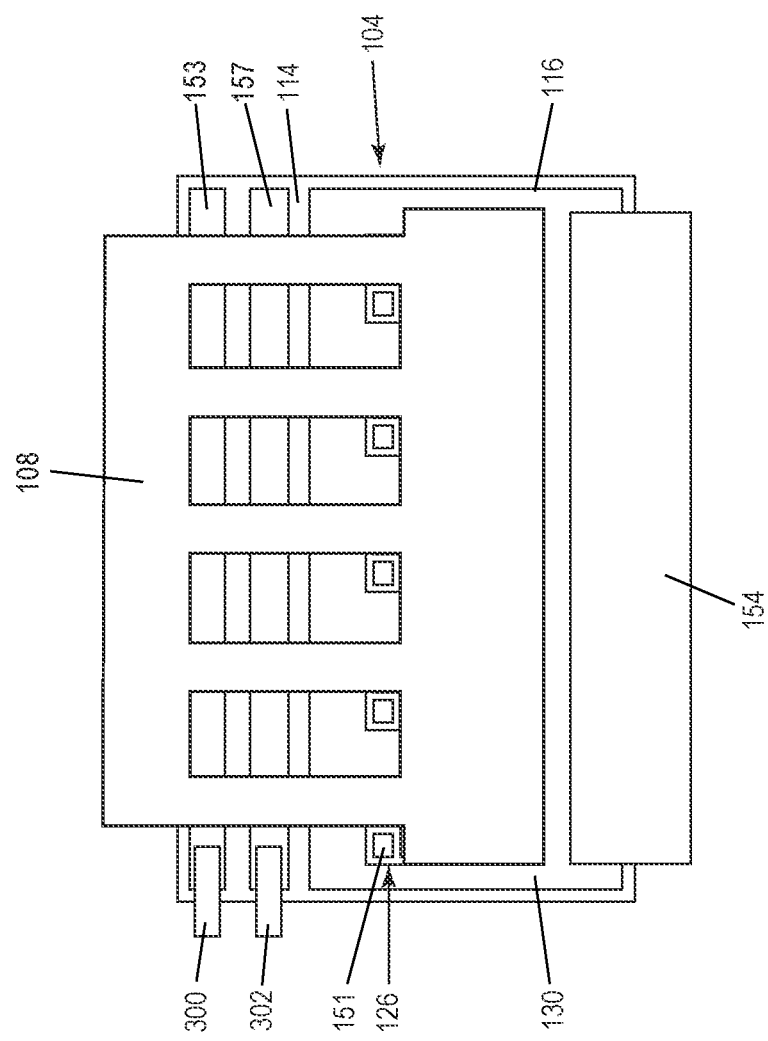

FIG. 3B shows the first (lower) side 110 (out of view in FIG. 3B) of the AC bus bar 108 connected to the source terminal 134 of each first power transistor die 126. The AC bus bar 108 may be provided as a lead frame or other type of patterned metallic sheet, for example. A spacer 136 (out of view in FIG. 3B) such as a Cu block may be interposed between the source terminal 134 of each first power transistor die 126 and the first side 110 of the AC bus bar 108, to provide a controlled spacing that avoids contact between the source terminal 134 of each first power transistor die 126 and the first side 110 of the AC bus bar 108.

Figure 3C:
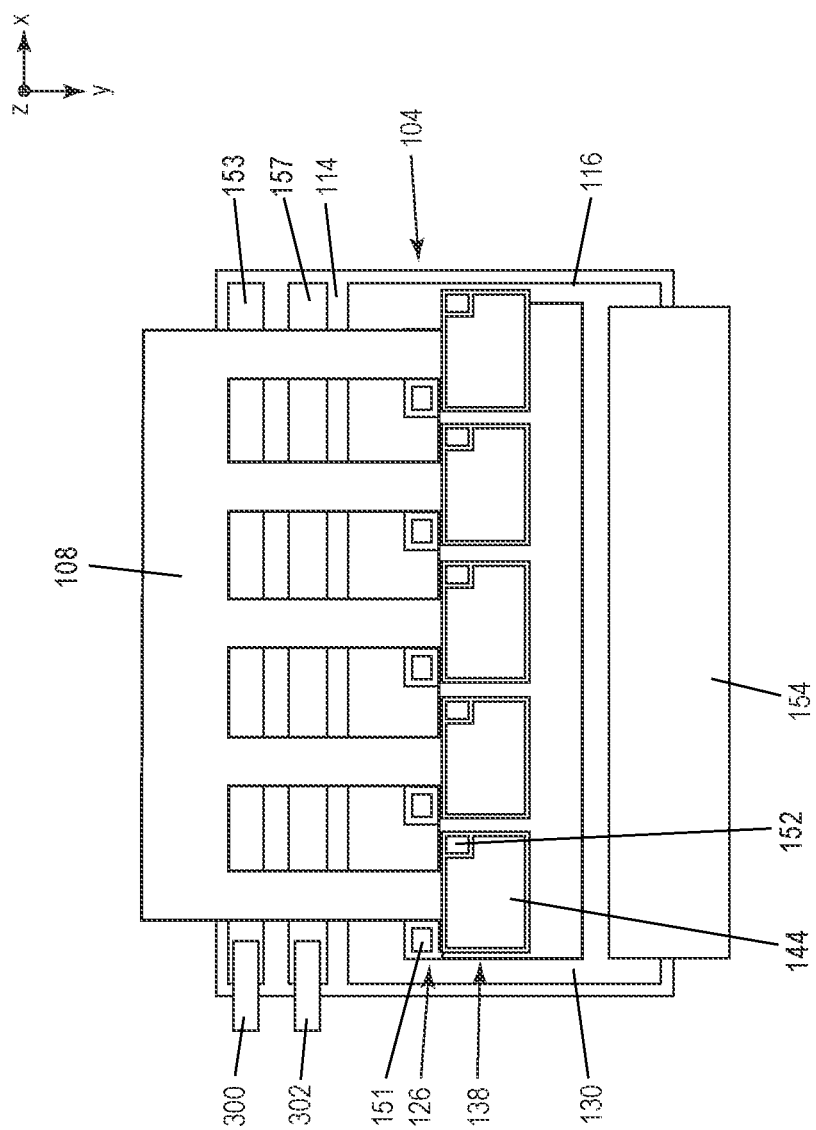

FIG. 3C shows a plurality of second power transistor dies 138 attached to the second (upper) side 112 of the AC bus bar 108, where the drain terminal 140 (out of view in FIG. 3C) of each second power transistor die 138 is electrically and thermally connected to the second side 112 of the AC bus bar 108. Five (5) second power transistor dies 138 are shown in FIG. 3C, as an example. However, more or less second power transistor dies 138 may be used. In general, one or more second power transistor dies 138 is attached to the second side 112 of the AC bus bar 108. If more than one second power transistor die 138 is used, the second power transistor dies 138 may be electrically coupled in parallel within the power semiconductor module 100 to form a switch device such as a low-side switch of a half bridge.

In FIG. 3C, the first power transistor dies 126 and the second power transistor dies 138 are identical, meaning that the first power transistor dies 126 and the second power transistor dies 138 are the same exact die type (e.g., a SiC MOSFET die). This does not necessarily mean that the first power transistor dies 126 and the second power transistor dies 138 have the same physical dimensions (e.g., length, width, thickness, etc.) and/or operating parameters (e.g., threshold voltage, rated voltage, rated current, etc.) due to process variation that is inherent when producing the power transistor dies 126, 128.

FIG. 3C also shows each second power transistor die 138 vertically overlapping a respective first power transistor die 126. In a horizontal plane defined by the x and y directions in FIG. 3C, each second power transistor die 138 is rotated 90° relative to the underlying first power transistor die 126 such that the gate terminal 151 of the underlying first power transistor die 126 is unobstructed by the overlying second power transistor die 138 and therefore accessible for contacting, probing, bonding, etc.

Figure 3D:
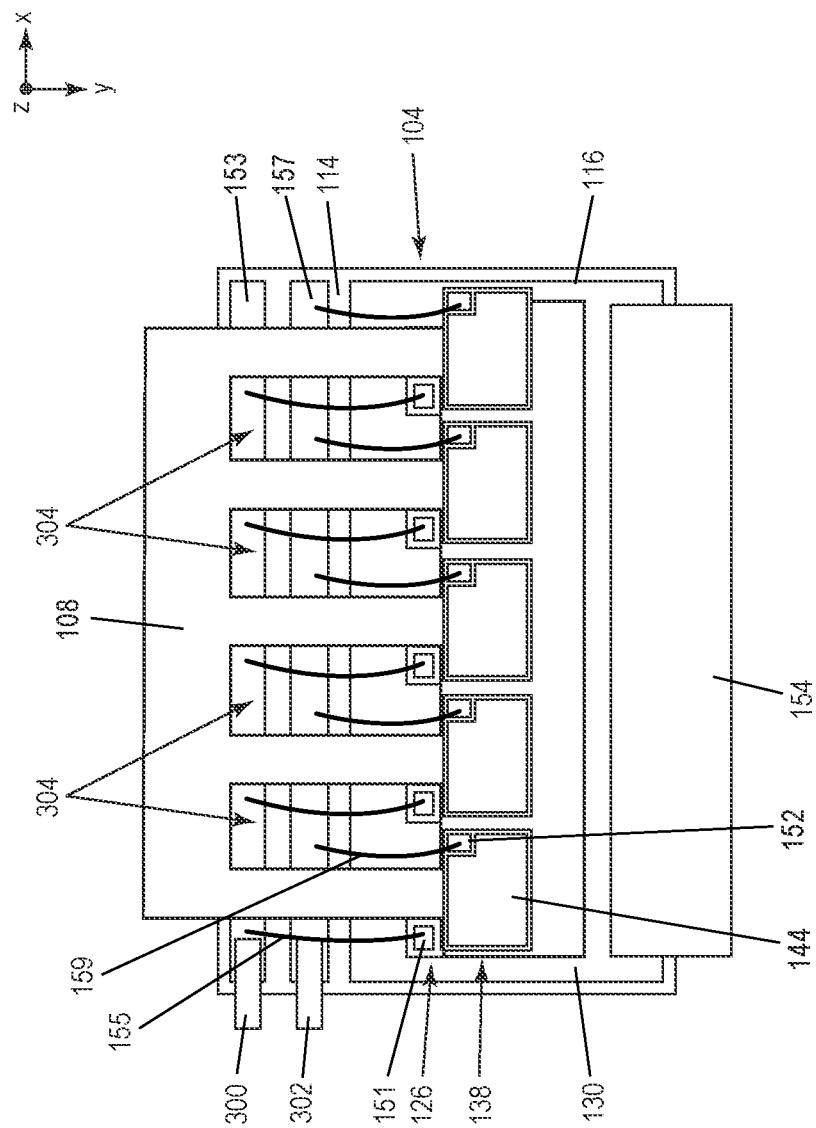

FIG. 3D shows the gate terminal 151 of each first power transistor die 126 electrically connected to the corresponding metallic gate region 153 of the first substrate 104 by a first bond wire 155. Each first bond wire 155 that vertically overlaps with the AC bus bar 108 passes through a gap 304 in the AC bus bar 108, to accommodate the height of the first bond wire 155 without shorting the first bond wire 155 to the AC bus bar 108.

FIG. 3D also shows the gate terminal 152 of each second power transistor die 138 electrically connected to the corresponding metallic gate region 157 of the first substrate 104 by a second bond wire 159. Each second bond wire 159 that vertically overlaps with the AC bus bar 108 passes through the same or different gap 304 in the AC bus bar 108 as the effected first bond wire(s) 155, to accommodate the height of the second bond wire 159 without shorting the second bond wire 159 to the AC bus bar 108.

Figure 3E:
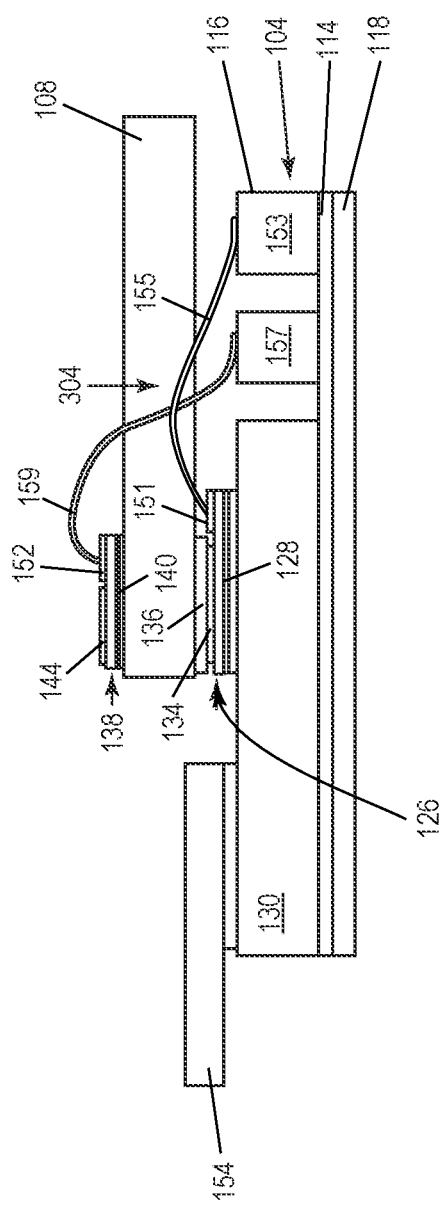

FIG. 3E illustrates a cross-sectional view after the processing shown in FIG. 3D, in the region where a first bond wire 155 and a second bond wire 159 pass through the same gap 304 in the AC bus bar 108.

Figure 3F:
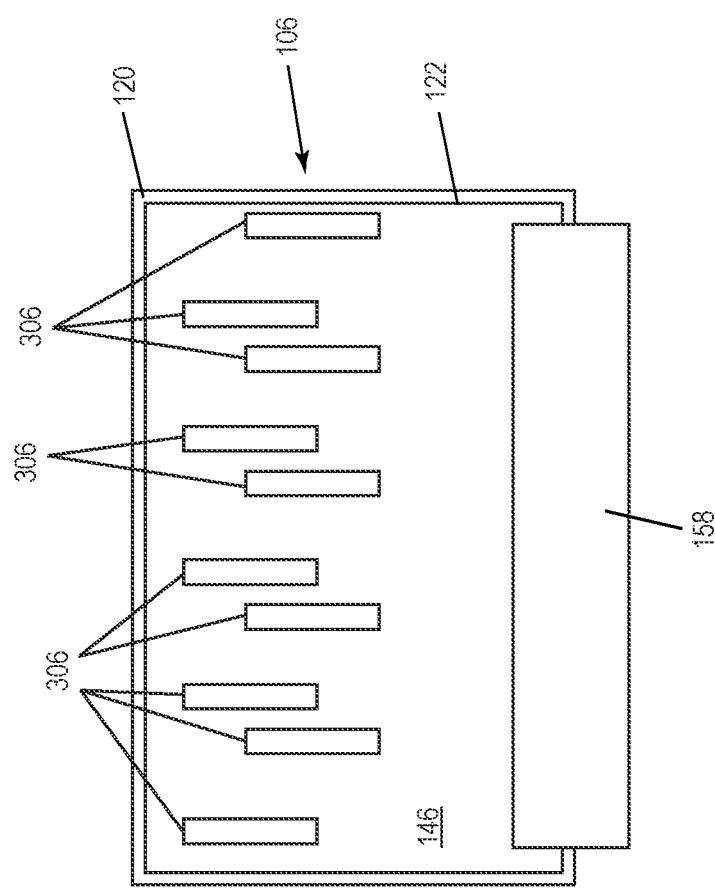

FIG. 3F shows the inner (lower) metallized side 122 of the second substrate 106. In FIG. 3F, the inner metallized side 122 of the second substrate 106 has one or more gaps 306 which may extend through the entire thickness of the inner metallized side 122 such that the insulating body 120 of the second substrate 106 is exposed through each gap 306 in the inner metallized side 122. The gap(s) 306 instead may extend only partly through the inner metallized side 122 of the second substrate 106 such that the insulating body 120 is not exposed at the inner (lower) side of the second substrate 106.

Figure 3G:
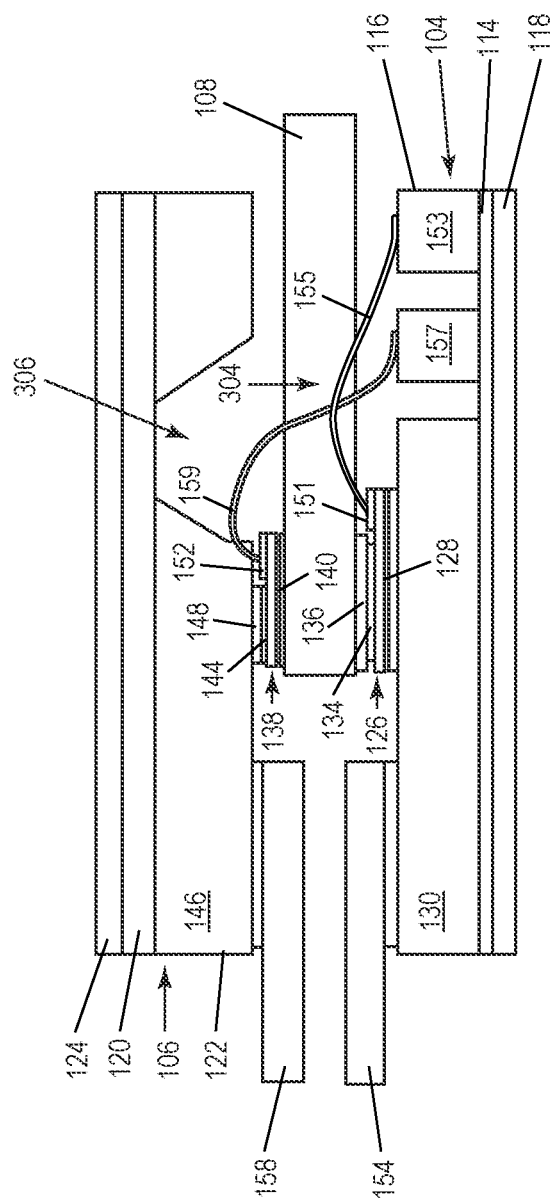

FIG. 3G illustrates the same cross-sectional view as FIG. 3E, but after the first metallic region 146 of the second substrate 106 is thermally and electrically connected to the source terminal 144 of each second power transistor die 138 by a corresponding spacer 148. Each spacer 148 ensures adequate clearance between the first metallic region 146 of the second substrate 106 and the gate terminal 152 of the corresponding second power transistor die 138.

Each second bond wire 159 that is connected to the gate terminal 152 of a second power transistor die 138 that vertically overlaps with the second substrate 106 is received by a corresponding gap 306 in the inner metallized side 122 of the second substrate 106 to avoid a short between the source and gate potentials. Each second bond wire 159 that vertically overlaps with the AC bus bar 108 passes through a corresponding gap 304 in the AC bus bar 108 to facilitate a connection to the corresponding metallic gate region 157 of the first substrate 104 and avoid a short between the AC/switch node and gate potentials. After the die connections are made, the power transistor dies 126, 138 may be encapsulated in a mold body 150 to yield the power semiconductor module shown in FIG. 1 or FIG. 2. The encapsulation process may involve injection molding, film-assisted molding, etc.

The embodiments described herein provide a power semiconductor module that is easier to produce because of further points of support. Also, the AC bus bar is cooled which might become necessary at high currents. In addition, the thermal resistance of the module is improved by providing auxiliary heat pathways in addition to the main heat pathways within the module.

Although the present disclosure is not so limited, the following numbered examples demonstrate one or more aspects of the disclosure.

Example 1. A power semiconductor module, comprising: a first substrate; a second substrate; an AC bus bar having a first side that faces the first substrate and a second side that faces the second substrate; a first power transistor die having a drain terminal connected to a first metallic region of the first substrate and a source terminal connected to the first side of the AC bus bar; a second power transistor die having a drain terminal connected to the second side of the AC bus bar and a source terminal connected to a first metallic region of the second substrate; a mold body encapsulating the first power transistor die and the second power transistor die; a first DC bus bar connected to the first metallic region of the first substrate and protruding from a first side of the mold body; and a second DC bus bar connected to the first metallic region of the second substrate, vertically overlapping the first DC bus bar, and protruding from the first side of the mold body, wherein the AC bus bar protrudes from a different side of the mold body as the first and second DC bus bars.

Example 2. The power semiconductor module of example 1, further comprising: a thermally conductive body connected between a second metallic region of the first substrate and the first side of the AC bus bar, wherein the second metallic region of the first substrate is electrically isolated from the first metallic region of the first substrate, wherein the thermally conductive body has a higher thermal conductivity than the mold body.

Example 3. The power semiconductor module of example 2, wherein the thermally conductive body comprises a metallic or ceramic spacer attached to the second metallic region of the first substrate and the first side of the AC bus bar.

Example 4. The power semiconductor module of example 2, wherein the thermally conductive body comprises a sintered joint between the second metallic region of the first substrate and the first side of the AC bus bar.

Example 5. The power semiconductor module of any of examples 1 through 4, further comprising: a thermally conductive body connected between the second side of the AC bus bar and a second metallic region of the second substrate, wherein the second metallic region of the second substrate is electrically isolated from the first metallic region of the second substrate, wherein the thermally conductive body has a higher thermal conductivity than the mold body.

Example 6. The power semiconductor module of example 5, wherein the thermally conductive body comprises a metallic or ceramic spacer attached to the second metallic region of the second substrate and the second side of the AC bus bar.

Example 7. The power semiconductor module of example 5, wherein the thermally conductive body comprises a sintered joint between the second metallic region of the second substrate and the second side of the AC bus bar.

Example 8. The power semiconductor module of example 1, further comprising: a first thermally conductive body connected between a second metallic region of the first substrate and the first side of the AC bus bar; and a second thermally conductive body connected between the second side of the AC bus bar and a second metallic region of the second substrate, wherein the second metallic region of the first substrate is electrically isolated from the first metallic region of the first substrate, wherein the second metallic region of the second substrate is electrically isolated from the first metallic region of the second substrate, wherein both the first thermally conductive body and the second thermally conductive body have a higher thermal conductivity than the mold body.

Example 9. The power semiconductor module of example 8, wherein the first thermally conductive body comprises a first metallic or ceramic spacer attached to the second metallic region of the first substrate and the first side of the AC bus bar, and wherein the second thermally conductive body comprises a second metallic or ceramic spacer attached to the second metallic region of the second substrate and the second side of the AC bus bar.

Example 10. The power semiconductor module of example 8, wherein the first thermally conductive body comprises a first sintered joint between the second metallic region of the first substrate and the first side of the AC bus bar, and wherein the second thermally conductive body comprises a second sintered joint between the second metallic region of the second substrate and the second side of the AC bus bar.

Example 11. The power semiconductor module of any of examples 1 through 10, wherein a gate terminal of the first power transistor die is electrically connected to a second metallic region of the first substrate by a first bond wire that passes through a gap in the AC bus bar, and wherein a gate terminal of the second power transistor die is electrically connected to a third metallic region of the first substrate by a second bond wire that passes through the same or different gap in the AC bus bar.

Example 12. The power semiconductor module of any of examples 1 through 10, wherein a gate terminal of the first power transistor die is electrically connected to a second metallic region of the first substrate by a first bond wire that passes through a gap in the first metallic region of the second substrate, and wherein a gate terminal of the second power transistor die is electrically connected to a third metallic region of the first substrate by a second bond wire that passes through the same or different gap in the first metallic region of the second substrate.

Example 13. The power semiconductor module of any of examples 1 through 12, wherein the first power transistor die and the second power transistor die are identical, wherein the second power transistor die vertically overlaps the first power transistor die, and wherein in a horizontal plane, the second power transistor die is rotated 90° relative to the first power transistor die such that a gate terminal of the first power transistor die is unobstructed by the second power transistor die.

Example 14. The power semiconductor module of any of examples 1 through 13, further comprising: a thermally conductive body connected between the first metallic region of the first substrate and the first side of the AC bus bar, wherein the second power transistor die vertically overlaps the thermally conductive body, wherein the thermally conductive body has a higher thermal conductivity than the mold body.

Example 15. A method of producing a power semiconductor module, the method comprising: connecting a drain terminal of a first power transistor die to a first metallic region of a first substrate; connecting a first side of an AC bus bar to a source terminal of the first power transistor die; connecting a drain terminal of a second power transistor die to a second side of the AC bus bar; connecting a first metallic region of a second substrate to a source terminal of the second power transistor die; connecting a first DC bus bar to the first metallic region of the first substrate; connecting a second DC bus bar to the first metallic region of the second substrate; and encapsulating the first power transistor die and the second power transistor die in a mold body, wherein the first DC bus bar protrudes from a first side of the mold body, wherein the second DC bus bar vertically overlaps the first DC bus bar and protrudes from the first side of the mold body, wherein the AC bus bar protrudes from a different side of the mold body as the first and second DC bus bars.

Example 16. The method of example 15, further comprising: before the encapsulating, connecting a thermally conductive body between a second metallic region of the first substrate and the first side of the AC bus bar, wherein the second metallic region of the first substrate is electrically isolated from the first metallic region of the first substrate, wherein the thermally conductive body has a higher thermal conductivity than the mold body.

Example 17. The method of example 15, further comprising: before the encapsulating, connecting a thermally conductive body between the second side of the AC bus bar and a second metallic region of the second substrate, wherein the second metallic region of the second substrate is electrically isolated from the first metallic region of the second substrate, wherein the thermally conductive body has a higher thermal conductivity than the mold body.

Example 18. The method of any of examples 15 through 17, further comprising: before the encapsulating, connecting a first thermally conductive body between a second metallic region of the first substrate and the first side of the AC bus bar and a second thermally conductive body between the second side of the AC bus bar and a second metallic region of the second substrate, wherein the second metallic region of the first substrate is electrically isolated from the first metallic region of the first substrate, wherein the second metallic region of the second substrate is electrically isolated from the first metallic region of the second substrate, wherein both the first thermally conductive body and the second thermally conductive body have a higher thermal conductivity than the mold body.

Example 19. The method of any of examples 15 through 18, further comprising: before the encapsulating, electrically connecting a gate terminal of the first power transistor die to a second metallic region of the first substrate by a first bond wire that passes through a gap in the AC bus bar and electrically connecting a gate terminal of the second power transistor die to a third metallic region of the first substrate by a second bond wire that passes through the same or different gap in the AC bus bar.

Example 20. The method of any of examples 15 through 18, further comprising: before the encapsulating, electrically connecting a gate terminal of the first power transistor die to a second metallic region of the first substrate by a first bond wire that passes through a gap in the first metallic region of the second substrate and electrically connecting a gate terminal of the second power transistor die to a third metallic region of the first substrate by a second bond wire that passes through the same or different gap in the first metallic region of the second substrate.

Example 21. The method of any of examples 15 through 20, wherein the first power transistor die and the second power transistor die are identical, wherein the second power transistor die vertically overlaps the first power transistor die, and wherein the method further comprises: before the encapsulating, rotating, in a horizontal plane, the second power transistor die 90° relative to the first power transistor die such that a gate terminal of the first power transistor die is unobstructed by the second power transistor die.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
a first substrate;
a second substrate;
an AC bus bar having a first side that faces the first substrate and a second side that faces the second substrate;
a first power transistor die having a drain terminal connected to a first metallic region of the first substrate and a source terminal connected to the first side of the AC bus bar;
a second power transistor die having a drain terminal connected to the second side of the AC bus bar and a source terminal connected to a first metallic region of the second substrate;
a mold body encapsulating the first power transistor die and the second power transistor die;
a first DC bus bar connected to the first metallic region of the first substrate and protruding from a first side of the mold body; and
a second DC bus bar connected to the first metallic region of the second substrate, vertically overlapping the first DC bus bar, and protruding from the first side of the mold body,
wherein the AC bus bar protrudes from a different side of the mold body as the first and second DC bus bars.

2. The power semiconductor module of claim 1, further comprising:
a thermally conductive body connected between a second metallic region of the first substrate and the first side of the AC bus bar,
wherein the second metallic region of the first substrate is electrically isolated from the first metallic region of the first substrate,
wherein the thermally conductive body has a higher thermal conductivity than the mold body.

3. The power semiconductor module of claim 2, wherein the thermally conductive body comprises a metallic or ceramic spacer attached to the second metallic region of the first substrate and the first side of the AC bus bar.

4. The power semiconductor module of claim 2, wherein the thermally conductive body comprises a sintered joint between the second metallic region of the first substrate and the first side of the AC bus bar.

5. The power semiconductor module of claim 1, further comprising:
a thermally conductive body connected between the second side of the AC bus bar and a second metallic region of the second substrate,
wherein the second metallic region of the second substrate is electrically isolated from the first metallic region of the second substrate,
wherein the thermally conductive body has a higher thermal conductivity than the mold body.

6. The power semiconductor module of claim 5, wherein the thermally conductive body comprises a metallic or ceramic spacer attached to the second metallic region of the second substrate and the second side of the AC bus bar.

7. The power semiconductor module of claim 5, wherein the thermally conductive body comprises a sintered joint between the second metallic region of the second substrate and the second side of the AC bus bar.

8. The power semiconductor module of claim 1, further comprising:
a first thermally conductive body connected between a second metallic region of the first substrate and the first side of the AC bus bar; and
a second thermally conductive body connected between the second side of the AC bus bar and a second metallic region of the second substrate,
wherein the second metallic region of the first substrate is electrically isolated from the first metallic region of the first substrate,
wherein the second metallic region of the second substrate is electrically isolated from the first metallic region of the second substrate,
wherein both the first thermally conductive body and the second thermally conductive body have a higher thermal conductivity than the mold body.

9. The power semiconductor module of claim 8, wherein the first thermally conductive body comprises a first metallic or ceramic spacer attached to the second metallic region of the first substrate and the first side of the AC bus bar, and wherein the second thermally conductive body comprises a second metallic or ceramic spacer attached to the second metallic region of the second substrate and the second side of the AC bus bar.

10. The power semiconductor module of claim 8, wherein the first thermally conductive body comprises a first sintered joint between the second metallic region of the first substrate and the first side of the AC bus bar, and wherein the second thermally conductive body comprises a second sintered joint between the second metallic region of the second substrate and the second side of the AC bus bar.

11. The power semiconductor module of claim 1, wherein a gate terminal of the first power transistor die is electrically connected to a second metallic region of the first substrate by a first bond wire that passes through a gap in the AC bus bar, and wherein a gate terminal of the second power transistor die is electrically connected to a third metallic region of the first substrate by a second bond wire that passes through the same or different gap in the AC bus bar.

12. The power semiconductor module of claim 1, wherein a gate terminal of the first power transistor die is electrically connected to a second metallic region of the first substrate by a first bond wire that passes through a gap in the first metallic region of the second substrate, and wherein a gate terminal of the second power transistor die is electrically connected to a third metallic region of the first substrate by a second bond wire that passes through the same or different gap in the first metallic region of the second substrate.

13. The power semiconductor module of claim 1, wherein the first power transistor die and the second power transistor die are identical, wherein the second power transistor die vertically overlaps the first power transistor die, and wherein in a horizontal plane, the second power transistor die is rotated 90° relative to the first power transistor die such that a gate terminal of the first power transistor die is unobstructed by the second power transistor die.

14. The power semiconductor module of claim 1, further comprising:
  a thermally conductive body connected between the first metallic region of the first substrate and the first side of the AC bus bar,
  wherein the second power transistor die vertically overlaps the thermally conductive body,
  wherein the thermally conductive body has a higher thermal conductivity than the mold body.

15. A method of producing a power semiconductor module, the method comprising:
  connecting a drain terminal of a first power transistor die to a first metallic region of a first substrate;
  connecting a first side of an AC bus bar to a source terminal of the first power transistor die;
  connecting a drain terminal of a second power transistor die to a second side of the AC bus bar;
  connecting a first metallic region of a second substrate to a source terminal of the second power transistor die;
  connecting a first DC bus bar to the first metallic region of the first substrate;
  connecting a second DC bus bar to the first metallic region of the second substrate; and
  encapsulating the first power transistor die and the second power transistor die in a mold body,
  wherein the first DC bus bar protrudes from a first side of the mold body,
  wherein the second DC bus bar vertically overlaps the first DC bus bar and protrudes from the first side of the mold body,
  wherein the AC bus bar protrudes from a different side of the mold body as the first and second DC bus bars.

16. The method of claim 15, further comprising:
  before the encapsulating, connecting a thermally conductive body between a second metallic region of the first substrate and the first side of the AC bus bar,
  wherein the second metallic region of the first substrate is electrically isolated from the first metallic region of the first substrate,
  wherein the thermally conductive body has a higher thermal conductivity than the mold body.

17. The method of claim 15, further comprising:
  before the encapsulating, connecting a thermally conductive body between the second side of the AC bus bar and a second metallic region of the second substrate,
  wherein the second metallic region of the second substrate is electrically isolated from the first metallic region of the second substrate,
  wherein the thermally conductive body has a higher thermal conductivity than the mold body.

18. The method of claim 15, further comprising:
  before the encapsulating, connecting a first thermally conductive body between a second metallic region of the first substrate and the first side of the AC bus bar and a second thermally conductive body between the second side of the AC bus bar and a second metallic region of the second substrate,
  wherein the second metallic region of the first substrate is electrically isolated from the first metallic region of the first substrate,
  wherein the second metallic region of the second substrate is electrically isolated from the first metallic region of the second substrate,
  wherein both the first thermally conductive body and the second thermally conductive body have a higher thermal conductivity than the mold body.

19. The method of claim 15, further comprising:
  before the encapsulating, electrically connecting a gate terminal of the first power transistor die to a second metallic region of the first substrate by a first bond wire that passes through a gap in the AC bus bar and electrically connecting a gate terminal of the second power transistor die to a third metallic region of the first substrate by a second bond wire that passes through the same or different gap in the AC bus bar.

20. The method of claim 15, further comprising:
  before the encapsulating, electrically connecting a gate terminal of the first power transistor die to a second metallic region of the first substrate by a first bond wire that passes through a gap in the first metallic region of the second substrate and electrically connecting a gate terminal of the second power transistor die to a third metallic region of the first substrate by a second bond wire that passes through the same or different gap in the first metallic region of the second substrate.

21. The method of claim 15, wherein the first power transistor die and the second power transistor die are identical, wherein the second power transistor die vertically overlaps the first power transistor die, and wherein the method further comprises:
  before the encapsulating, rotating, in a horizontal plane, the second power transistor die 90° relative to the first power transistor die such that a gate terminal of the first power transistor die is unobstructed by the second power transistor die.

* * * * *